(12) United States Patent
Liu et al.

(10) Patent No.: US 11,171,075 B2
(45) Date of Patent: Nov. 9, 2021

(54) STACKED MICROFLUIDIC COOLED 3D ELECTRONIC-PHOTONIC INTEGRATED CIRCUIT

(71) Applicant: Telefonaktiebolaget LM Ericsson (publ), Stockholm (SE)

(72) Inventors: Neng Liu, Montreal (CA); Robert Brunner, Montreal (CA); Stephane Lessard, Mirabel (CA)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 107 days.

(21) Appl. No.: 16/490,094

(22) PCT Filed: Mar. 1, 2017

(86) PCT No.: PCT/IB2017/051198
§ 371 (c)(1),
(2) Date: Aug. 30, 2019

(87) PCT Pub. No.: WO2018/158613
PCT Pub. Date: Sep. 7, 2018

(65) Prior Publication Data
US 2020/0013699 A1    Jan. 9, 2020

(51) Int. Cl.
*H01L 23/473*        (2006.01)
*H01L 21/48*         (2006.01)
(Continued)

(52) U.S. Cl.
CPC ........ *H01L 23/473* (2013.01); *H01L 21/4882* (2013.01); *H01L 24/08* (2013.01);
(Continued)

(58) Field of Classification Search
CPC ..... H01L 21/4882; H01L 23/34; H01L 23/42; H01L 23/44; H01L 23/46–473; H01L 25/0657; H01L 25/167
See application file for complete search history.

(56) References Cited

U.S. PATENT DOCUMENTS 7,928,563 B2    4/2011   Bakir et al.
8,546,930 B2    10/2013  Bakir et al.
(Continued)

OTHER PUBLICATIONS

Bar-Cohen, Avram, et al., "DARPA's Intra/Interchip Enhanced Cooling (ICECool) Program", CS Mantech Conference, New Orleans, Louisiana, USA, May 13-16, 2013, pp. 171-174.
(Continued)

*Primary Examiner* — Zandra V Smith
*Assistant Examiner* — Molly K Reida
(74) *Attorney, Agent, or Firm* — Murphy, Bilak & Homiller, PLLC

(57) ABSTRACT

An electronic-photonic integrated-circuit assembly comprises a carrier substrate (310) and one or more integrated-circuit dies (330, 340) bonded to one another so as to form a die stack with exterior surfaces corresponding to an outer surface of a first one of the integrated-circuit dies and to an outer surface of a second one of the integrated-circuit dies, where at least one of the integrated-circuit dies includes one or more integrated photonic devices. One or more channels or passages (320) are formed into the outer surface of the first one of the integrated-circuit dies, and a first surface of the carrier substrate (310) is bonded to the outer surface of the first one of the integrated-circuit dies, thereby enclosing the one or more channels or passages (320), The integrated-circuit dies are electrically connected to each other via electrically conductive through-wafer interconnects or electrically conductive through-wafer vias.

18 Claims, 7 Drawing Sheets

(51) Int. Cl.
 H01L 25/16 (2006.01)
 H01L 23/00 (2006.01)
(52) U.S. Cl.
 CPC ............ *H01L 24/80* (2013.01); *H01L 25/167* (2013.01); *H01L 2224/08146* (2013.01); *H01L 2224/80895* (2013.01); *H01L 2224/80896* (2013.01)

(56) References Cited

U.S. PATENT DOCUMENTS

| | | | |
|---|---|---|---|
| 2003/0085024 | A1 | 5/2003 | Santiago et al. |
| 2006/0078475 | A1 | 4/2006 | Tai et al. |
| 2009/0108435 | A1 | 4/2009 | Bernstein et al. |
| 2009/0294954 | A1 | 12/2009 | Bakir et al. |
| 2013/0182998 | A1 | 7/2013 | Andry et al. |

OTHER PUBLICATIONS

Green, Craig, et al., "A Review of Two-Phase Forced Cooling in Three-Dimensional Stacked Electronics: Technology Integration", Journal of Electronic Packaging, vol. 137, Dec. 2015, pp. 1-9.

Kandlikar, Satish G, "Review and Projections of Integrated Cooling Systems for Three-Dimensional Integrated Circuits", Mechanical Engineering Department and Microsystems Engineering Department, Rochester Institute of Technology, Rochester, NY 14623, vol. 6, Jun. 2014, pp. 1-11.

Keesey, Lori, "NASA investigates techniques for cooling 3-D integrated circuits stacked like a skyscraper", NASA's Goddard Space Flight Center, Oct. 27, 2015, pp. 1-3.

Pangracious, V., et al., "Chapter 2 Three-Dimensional Integration: A More Than Moore Technology", In Three-Dimensional Design Methodologies for Tree-based FPGA Architecture, Springer International Publishing, Switzerland, 2015, pp. 13-41.

Settaluri, Krishna T., et al., "Demonstration of an Optical Chip-to-Chip Link in a 3D Integrated Electronic-Photonic Platform", IEEE, European Solid-State Circuits Conference (ESSCIRC), 2015, pp. 156-159.

Yoo, S. J. Ben, et al., "Heterogeneous 2D/3D photonic integrated microsystems", Microsystems & Nanoengineering (2016) 2, 16030; doi:10.1038/micronano.2016.30, Apr. 2016, pp. 1-9.

Zhang, Yue, et al., "3D Stacked MicroOuidic Cooling for High-Performance 3D ICs", IEEE 62nd Electronic Components and Technology Conference, 2012, pp. 1644-1650.

Gambino, Jeffrey P., et al., "An overview of through-silicon-via technology and manufacturing challenges", Science Direct; Microelectronic Engineering 135, 2015, pp. 73-106.

Morra, James, "Researchers Move Liquid Cooling Up Against FPGA Chips", Microprocessors content from Electronic Design; http://electronicdesign.com/microprocessors/researchersmoveliquidcoolingagainstfpgachips, Nov. 30, 2015, pp. 1-4.

Stojanović, V., et al., "High-density 3D Electronic-Photonic Integration", https://www.semanticscholar.org/paper/High-density-3D-electronic-photonic-integration-Stojanovi%C4%87-Settaluri/35ddf24dcd41c338034d03add4cc10726d891c12, 2015, pp. 1-2.

STACKED MICROFLUIDIC COOLED 3D ELECTRONIC-PHOTONIC INTEGRATED CIRCUIT

TECHNICAL FIELD

The present disclosure is generally related to three-dimensional packaging of integrated circuits (ICs), and is more particularly related to three-dimensional integrated photonic-electronic IC assemblies.

BACKGROUND

Today's data centers typically comprise numerous server racks, each with many pluggable boards that together carry large numbers of core memories and processors. These boards are connected to one another by electrical or optical cables, which can limit the communication bandwidth between high-speed processors and memory. To address these issues in high-performance data centers, vertically stacked, three-dimensional (3D), packaging of these chips has been demonstrated to be a good solution which can reduce the interconnect path and interconnect delay to/from the memory layer. Therefore, several 3D electronic and 3D photonic systems have been developed, over the past decade.

One key issue slowing the trend toward ever-faster and denser storage and processing solutions is the delays caused by electronic circuit interconnects. These delays are due to the increasing number of interconnects, with more resistive, thinner, wires and increased wire-to-wire capacitance arising from the closer spacing between the interconnects. One approach to reducing these delays is to vertically stack electronic circuits in three dimensions, as compared to traditional integrated circuits and multi-chip modules (MCMs) that utilize design layouts in two dimensions (2D). The results of this vertical stacking may be referred to as a "3D Electronic Integrated Circuit," or "3D-EIC," an example of which is illustrated in FIG. 1.

As seen in FIG. 1, IC dies carrying different functions of a chip-level circuit, such as a memory layer, a processor layer, and an analog layer, can be stacked vertically, on a substrate, to create a heterogeneous integration of electronic ICs. As shown in the figure, the layers (i.e., the individual IC dies) are interconnected by through-silicon vias (TSVs) or micro-bumps. The 3D-EIC approach not only increases the density and performance of the electronic circuit, but also reduces the length of interconnects, which in turn reduces wire delays and power losses. 3D-EICs are described in Pangracious, V., Z. Marrakchi, and H. Mehrez, *Three-Dimensional Integration: A More Than Moore Technology*, in *Three-Dimensional Design Methodologies for Tree-based FPGA Architecture*, 2015, Springer International Publishing: Cham p. 13-41.

Temperature management is an important challenge in IC design in general, and becomes a more serious issue in 3D-EIC designs, due to the increasing power flux resulting from 3D stacking. This issue is discussed, for example, in Bar-Cohen, A., J. J. Maurer, and J. G. Felbinger, *DARPA's Intra/Interchip Enhanced Cooling (ICECool) Program*, in *CS MANTECH Conference*, May 13-16, 2013. Attaching a heatsink, an approach that is widely used with traditional 2D electronic integrated circuits, can only effectively remove the heat from the top or bottom layer of a 3D EIC. The heat from other layers, which are sandwiched between electronic isolation layers made of passive $SiO_2$, is blocked, and can cause very high temperatures inside the 3D assembly.

Microfluidic cooling is a promising technique that can be used to remove heat from a 3D EIC. Microfluidic cooling can be used to scale down the cooling heat sink size, or eliminate the need for a hint sink entirely. FIG. 2 illustrates an example of a 3D EIC that is provided with microfluidic cooling. As seen in the figure, several IC dies are stacked, and attached to a carrier 210. However, several channels or passages 220 are provided between the stack of IC dies and the carrier 210, with these channels or passages being sized and suitable for the passage of fluids. Cooling liquid can be supplied to the channels or passages 220 via a cooling liquid inlet 230, and is removed via a cooling liquid outlet 240.

An interlayer microfluidic channel for cooling 3D EICs was demonstrated in 2007. A so-called two-phase cooling interlay has attracted great attention due to its advantages in reduced coolant flow rate and pump power when dissipating the same heat, as compared to single phase cooling. Also, this approach offers great temperature uniformity throughout the chips. This technology is described in Green, C., et al., *A Review of Two-Phase Forced Cooling in Three-Dimensional Stacked* Electronics: Technology Integration. Journal of Electronic Packaging, 2015. 137(4): p. 040802.

As the trend of electronic circuit packaging moves from monolithically 2D to 3D integration, there is an increasing interest in 3D integration of photonics integrated circuits (PICs), in addition to the ongoing development of monolithic 2D PICs. This is discussed, for example, in Yoo, S. J. B., B. Guan, and R. P. Scott, *Heterogeneous 2D/3D photonic integrated microsystems*, Microsystems & Nanoengineering, 2016, 2: p. 16030. With 3D-PICs, different 2D-PIC layers are vertically stacked together, using micro-bumps, wafer-bonding, and epitaxy. Optical interconnects between IC die layers can be accomplished using optical TSV, vertical waveguides, periodic photonic crystal structures, and vertically hybrid active materials or photonic devices applied onto a silicon passive photonic platform.

The next step in increased integration is the 3D Electronic Photonic Integrated Circuit (EPIC), which represents a chip-scale integration of an EIC and PIC. The EPIC is expected to be more cost effective, reliable, and highly integrated, which can address communication problems in future data centers that are not solvable by electronics or photonics alone. An EPIC is described in Settaluri, K. T., et al. *Demonstration of an optical chip-to-chip link in a 3D integrated electronic-photonic platform*, in *European Solid-State Circuits Conference (ESSCIRC)*, ESSCIRC 2015-$41^{st}$2015.

SUMMARY

A key problem with a 3D EPIC stack is thermal management. Vertically stacked layers increase the power density from pin-to-pin and the stacked dielectric intra-layers increase the thermal resistance of the stacked EPIC. Described herein are techniques and devices that address this problem.

According to several of the embodiments described herein, an electronic-photonic integrated-circuit assembly comprises two or more integrated-circuit dies bonded to one another so as to form a die stack with first and second primary exterior surfaces corresponding, respectively, to an outer surface of a first one of the integrated-circuit dies and to an outer surface of a second one of the integrated-circuit dies, where at least one of the two or more integrated-circuit dies includes one or more integrated photonic devices. The assembly further includes a carrier substrate. One or more channels or passages are formed into the outer surface of the first one of the integrated-circuit dies, and a first surface of the carrier substrate is bonded to the outer surface of the first one of the integrated-circuit dies, thereby enclosing the one or more channels or passages. Each of the two or more integrated-circuit dies is electrically connected to at least one other integrated-circuit die via an electrically conductive through-wafer interconnect or an electrically conductive through-wafer via.

Other embodiments described herein include a method of forming an electronic-photonic integrated-circuit assembly, where the method includes bonding two or more integrated-circuit dies to one another so as to form a die stack with first and second primary exterior surfaces corresponding, respectively, to an outer surface of a first one of the integrated-circuit dies and to an outer surface of a second one of the integrated-circuit dies. At least one of these two or more integrated-circuit dies comprises one or more integrated photonic devices, and the first one of the integrated-circuit dies has one or more channels or passages formed into the outer surface of the first integrated circuit die. The method further includes bonding a first surface of a carrier substrate to the outer surface of the first one of the integrated-circuit dies, thereby enclosing the one or more channels or passages, and electronically connecting each of the integrated-circuit dies to at least one other integrated-circuit die via an electrically conductive through-wafer interconnect or an electrically conductive through-wafer via.

A related method of forming an electronic-photonic integrated-circuit assembly comprises forming one or more channels or passages into a first surface of a first semiconductor wafer, bonding a first surface of a carrier substrate to the first surface of the first semiconductor wafer, thereby enclosing the one or more channels or passages, and forming one or more electronic integrated circuits and/or one or more integrated photonic devices into and/or on a second surface of the first semiconductor wafer. This method further comprises bonding a first surface of a second semiconductor wafer to the second surface of the first semiconductor wafer, where the second semiconductor wafer comprises one or more electronic integrated circuits and/or one or more integrated photonic devices formed into and/or on the second semiconductor wafer. This method still further includes forming at least one electrical connection from an electronic integrated circuit or photonic device of the first semiconductor wafer to an electronic integrated circuit or photonic device of the second semiconductor wafer, using an electrically conductive through-wafer interconnect or an electronically conductive through-wafer via.

Several variations of the above-summarized devices and methods are detailed below, and illustrated in the attached figures.

DETAILED DESCRIPTION

Figure 1:
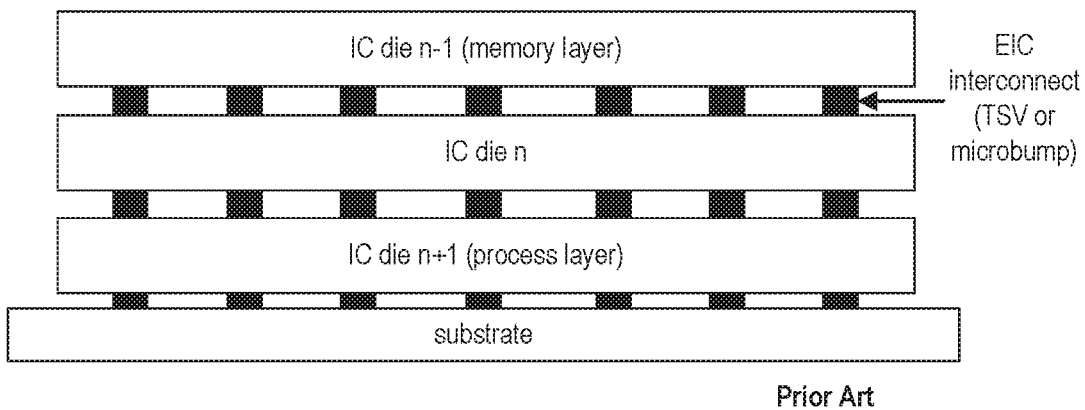
FIG. 1 illustrates an example 3D electronic integrated circuit (EIC).
Figure 2:
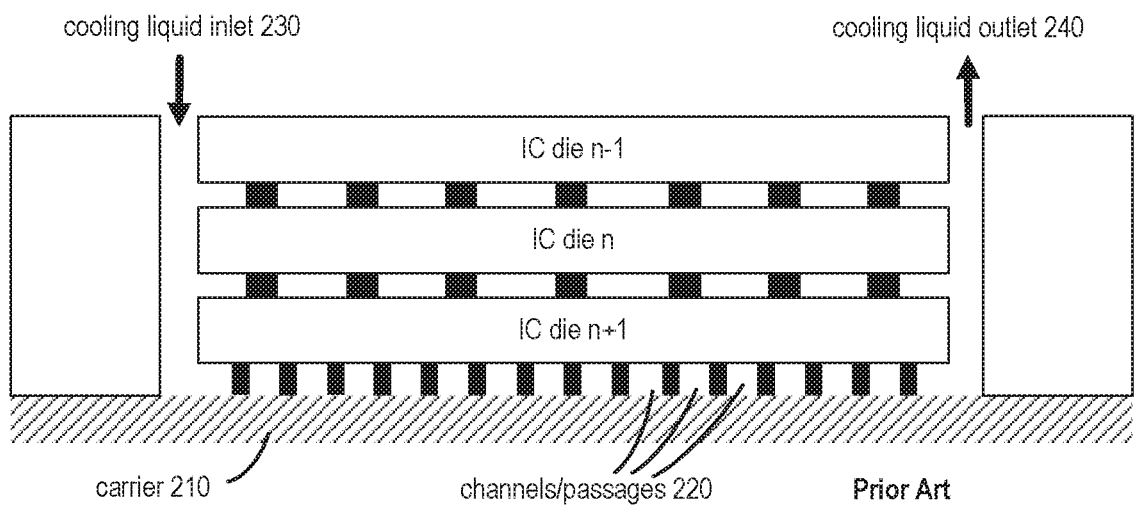
FIG. 2 illustrates a 3D EIC with microfluidic cooling.

As discussed in the Background section above, a next step in increased integration of IC dies is the 3D-EPIC, which represents a chip-scale integration of one or more EICs and one or more PICs. A key problem with 3D EPIC stacks, however, is thermal management, since the vertically stacked layers increase the power density from pin-to-pin and the stacked dielectric intra-layers increase the thermal resistance of the stacked EPIC. Below, solutions to this thermal problem in 3D-EPIC units are addressed in three main parts.

A first part of several of the solutions described herein is related to shortening the interconnect lengths which is the main cause of the thermal problem. The electronic and photonic chip layers can be integrated with each other by direct wafer bonding or epitaxy, instead of using microbumps. The active region, e.g., III-V material or Germanium (Ge), can be grown on the silicon wafer, followed by micro/nanofabrication of the active photonic devices using standard foundry techniques and practices. Through-wafer interconnects (TWIs) or through-wafer vias can be used to interconnect between one electronic layer and another electronic layer, or between an electronic layer and a photonic layer.

A second part of at least some of the solutions described herein is related to reducing or eliminating energy-inefficient copper connectivity between neighboring functional blocks, e.g. core-to-core processors and memory, on both the same and different IC: die planes (layers), whether in one or in several stacked 3D-EPIC units. Vertical optical interconnectivity in a 3D-EPIC between the different photonic layers/stacks can be resolved with the utilization of 3D photonic crystal structures, vertical waveguides, and/or optical TWVs.

A third part of several of the solutions described herein is related to high-efficiency thermal heat extraction from a 3D-EPIC, which is done by employing micro/nano-fluidic channel cooling to the EPIC circuit block. The microfluidic coolant circuit includes microfluidic channels in the substrate layer and microfluidic vias, which may traverse multiple different layers. The microfluidic channels in the substrate can be fabricated through a micro-pin-fin technique, for example, where the substrate is then bonded to a glass base. A forced two-phase microfluidic flow system can then be used to cool the EPIC system, in some embodiments. Note that "microfluidics" should be understood to refer to the science and technology of manipulating and controlling fluids, e.g., in the range of microliters to picoliters, in networks of channels with lowest dimensions ranging from several to several hundreds of micrometers. Thus a "microfluidic channel" is a channel or passage having dimensions on this order and which is suitable for transporting fluids in quantities of this range. "Nanofluidics" may be understood as referring to similar technology, but involving dimensions in nanometer scale and quantities one to three orders of magnitude below those for microfluidic technologies.

As will be discussed in further detail below, these microfluidic-cooled EPIC units can be stacked vertically, or laid out in 2D/3D arrays, to provide complex and highly integrated EPIC assemblies. Advantages of the basic building block of a stackable 3D-EPIC described herein, sometimes referred to herein as a 3D-EPIC unit, include that these 3D-EPIC units facilitate the integration of the following elements in an EPIC: optical connectivity for all intra/inter-chip signaling, copper connectivity for only power distribution, and die level cooling. The solutions described herein include a novel modularity scheme to enable the scaling of an EPIC system capable of supporting millions of processor cores in an IC chip package. The 3D-EPIC unit can be scaled in a multitude of arrangements, such as in a 3D-EPIC stack, a 2.5D array of EPIC units, or a 3D array of EPIC units. These solutions can enable the highest density computing with the lowest power consumption, while permitting flexible integration through the use of compatible Complementary metal-oxide-semiconductor (CMOS) foundry processes for both EIC and PIC fabrication.

Figure 3:
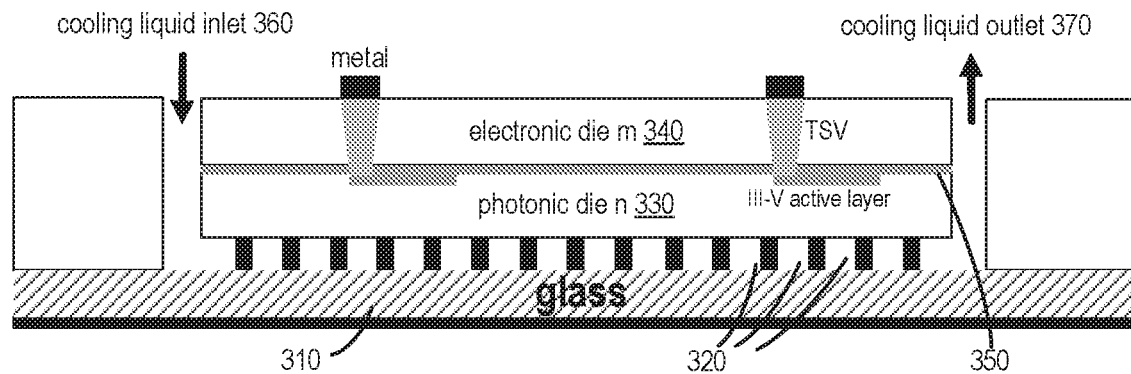
FIG. 3 illustrates an example microfluidic 3D electronic-photonic integrated circuit (EPIC) unit that contains one electronic die on top of one photonic die.

The general microfabrication process of a 3D-EPIC unit according to some embodiments of the presently disclosed techniques will be described below. A 3D-EPIC unit that contains an electronic layer on top of a photonic layer, as shown in FIG. 3, will be taken as an example. It will be appreciated that while FIGS. 3, 4, 5, and 6 each show a single EPIC unit, for simplicity, the processes discussed below may be applied at the wafer level, such that many EICs and PICs are fabricated and processed at the same time.

To produce a 3D-EPIC unit like the one shown in FIG. 3, the backside of a substrate wafer is first etched, to form one or microfluidic channels or passages 320 on the wafer's backside. A glass wafer 310 or other carrier substrate is then bonded to the processed substrate layer, to seal the microfluidic channels. On the top surface of the substrate layer, i.e., opposite the surface bonded to the glass wafer, III-V and germanium active layers are selective-area grown, along with micro/nanofabricated features, to form a photonic integrated circuit (PIC) 330, which is capped with a passivation oxide layer and metallized contacts.

A separate wafer is used to fabricate the EIC 340, e.g., using conventional CMOS processes. The EIC wafer is bonded to the assembly that includes the PIC and the glass substrate, e.g., using a silicon oxide bonding layer 350 between the PIC 330 and the EIC 340. Lastly, a cooling liquid inlet port 360 and outlet port 370 are dry- or wet-etched through these stacked 3D-EPIC multilayers, while metals and conductive TSVs are fabricated to conduct external electrical power to the 3D-EPIC unit. The bonded wafers discussed above comprise a crystal silicon wafer and a silicon wafer with silicon-on-insulator (SOI) on top.

Figure 4:
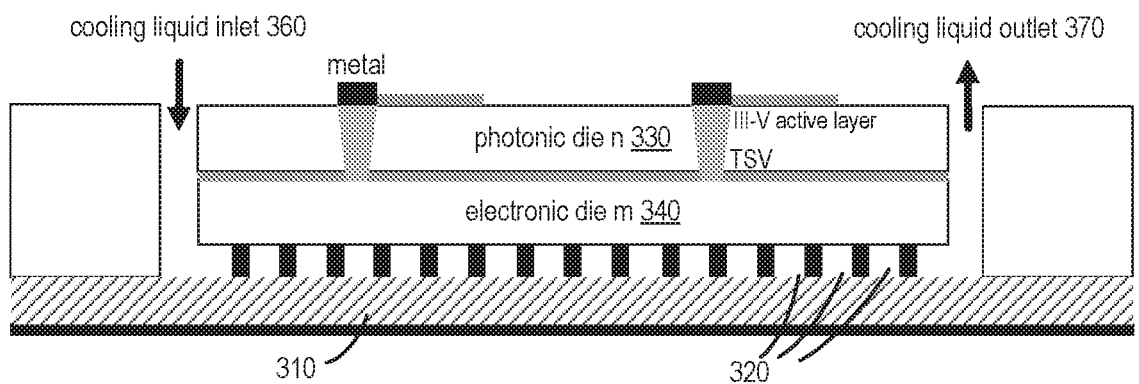
FIG. 4 illustrates an example microfluidic 3D-EPIC unit that contains one photonic die on top of one electronic die.

Other embodiments of 3D-EPIC "units" can be fabricated, as noted in the following examples, using similar steps as described above. For instance, while the 3D-EPIC unit shown in FIG. 3 has the electronic die 340 on top of the photonic die 330 (where "top" refers to an external surface opposite the glass carrier 310), other embodiments may have the photonic die 330 on top of the electronic die, as shown in FIG. 4.

Figure 5:
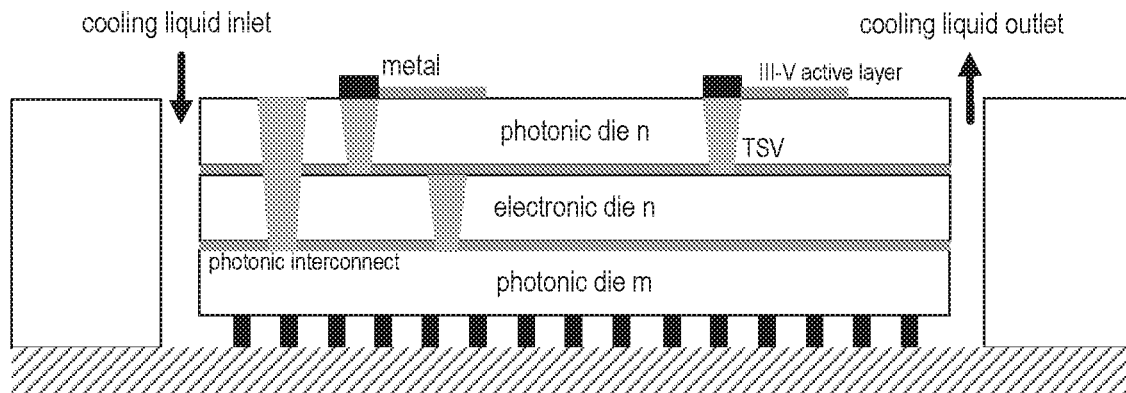
FIG. 5 illustrates an example 3D-EPIC unit that includes two photonic dies and an electronic die.

In other embodiments, one or more electronic dies can be sandwiched between two photonic dies, as shown in FIG. 5. In this 3D-EPIC system, a through-wafer interconnect (TWI) can be used as a photonic interconnect, to transmit optical signals from the top photonic layer to the bottom photonic layer.

Figure 6:
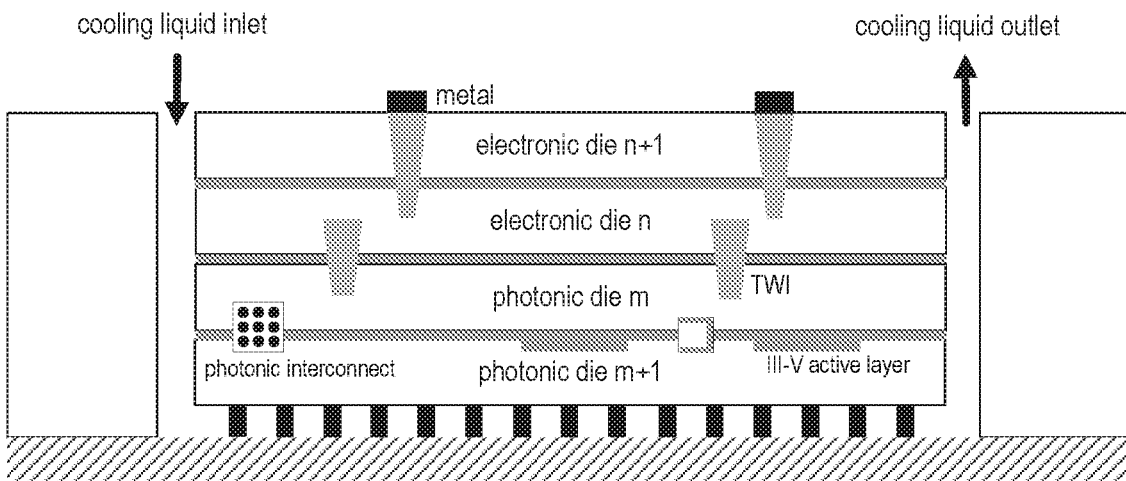
FIG. 6 shows an example 3D-EPIC unit that includes two electronic dies and two photonic dies.

Other stacks, with even more layers, are possible. FIG. 6, for example, shows a unit in which two electronic die layers (e.g., a memory layer and a processor layer) are grown or otherwise assembled on top of two photonic layers. Photonic and electronic TWIs can be used to transmit the signals. In the case of a photonic interconnect, 3D optical waveguides and/or photonic crystals can be used to transmit the optical signals. These 3D photonic structures can be fabricated through standard foundry processes, or using femtosecond (Fs) laser lithography. A Fs laser can be used to induce nano-hydrophilic defect lines, in some embodiments, where these nano-hydrophilic defect lines can be used to absorb chilled coolant, to enhance the cooling effect in a multi-layered 3D-EPIC unit, such as a unit comprising four or more layers.

Figure 7:
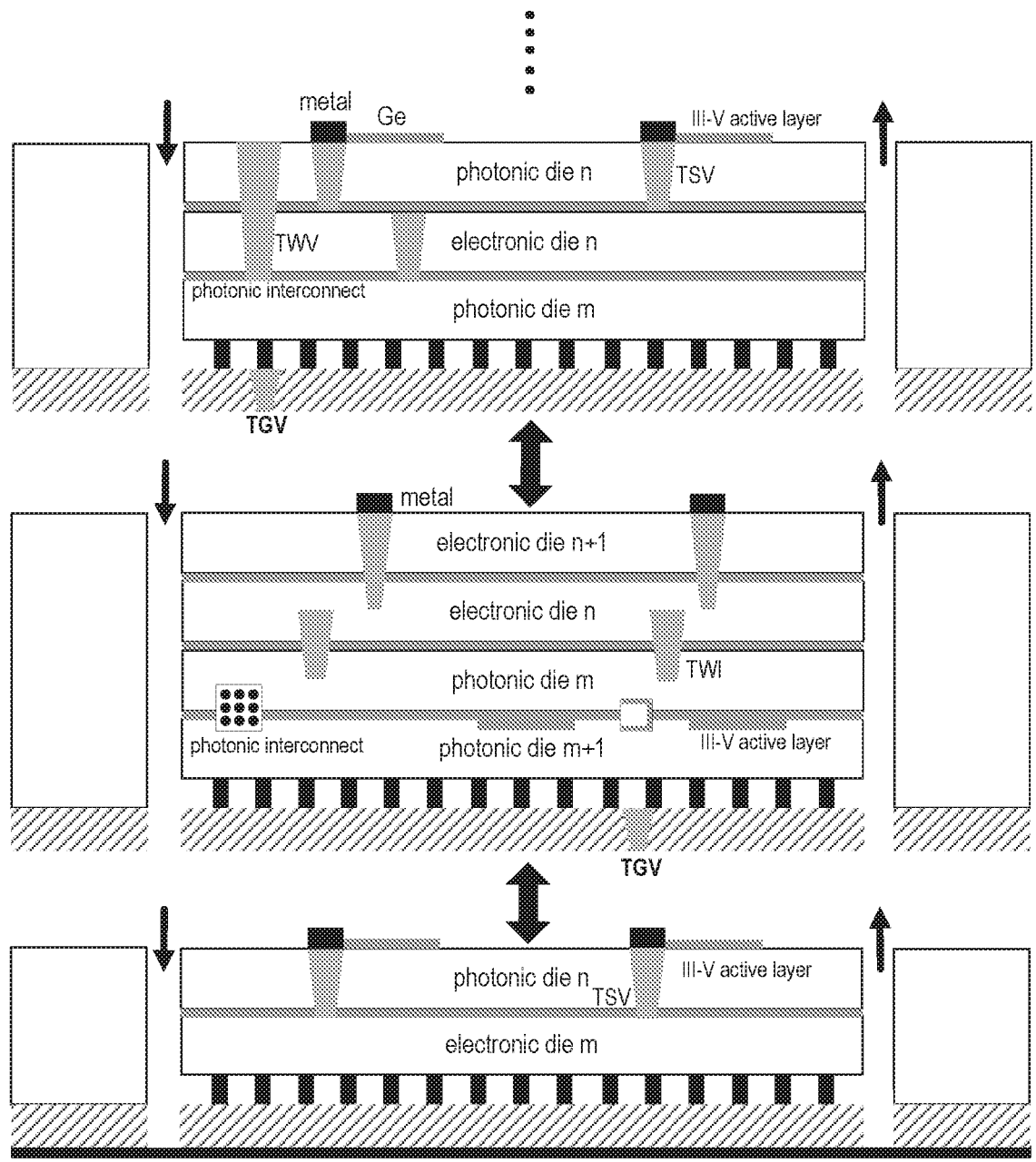
FIG. 7 illustrates the stacking of several microfluidic 3D-EPIC units.

In an additional fabrication step, two or more 3D-EPIC units can be vertically stacked, to achieve even higher levels of 3D integrate, thus creating a "3D-EPIC Stack." This can be done, for example, by employing glass bonding as shown in FIG. 7. After the multiple 3D-EPIC units are stacked and bonded to one another, a vertical microfluidic channel is etched through at least the glass carriers above the lowest glass carrier, in the illustrated example, to allow coolant to flow to and under each 3D-EPIC unit. Through-glass vias (TGV) are fabricated through the glass bases to transmit photonic and/or electronic signals between the stacked 3D EPIC units. In some embodiments, a conductive metal layer is deposited on the bottom surface of the 3D-EPIC base, e.g., to provide for power distribution.

Figure 8:
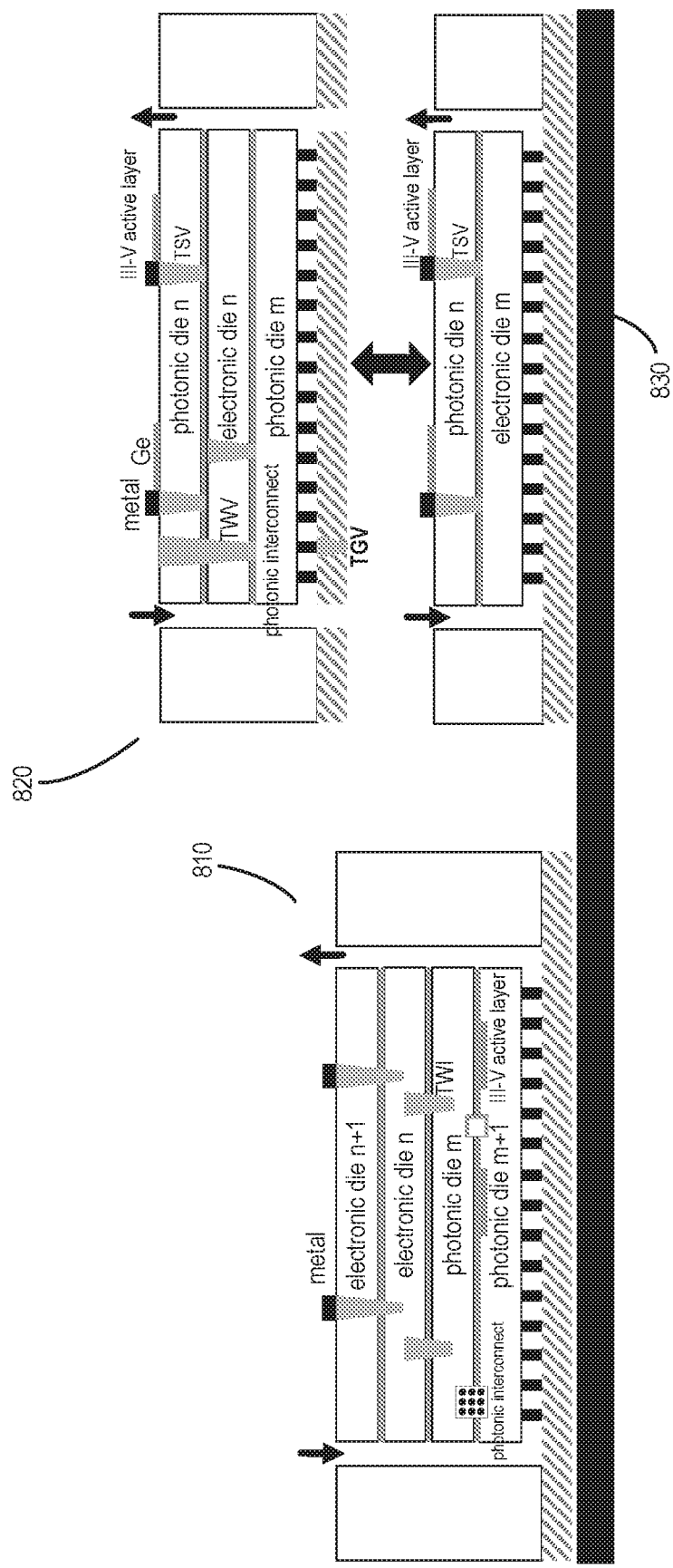
FIG. 8 illustrates the integration of a 3D-EPIC unit and 3D-EPIC stack on a substrate.

It will be appreciated that a combination of two 3D-EPIC units or 3D-EPIC stacks can be integrated onto a substrate, to construct a 3D-EPIC assembly. An example is shown in FIG. 8, where a 3D-EPIC unit 810 and a 3D-EPIC stack 820 are integrated onto a substrate 830. The substrate 830, in various embodiments, can function as a 2.5D passive optical interposer or 2.5D active optical switch, and/or may carry electrically conductive interconnects to distribute power and/or electrical signals among the 3D-EPIC units and 3D-EPIC stacks.

Note that the glass layer in the 3D-EPIC "unit" also serves as an ideal location to bury integrated parasitic components (e.g., capacitors and inductors) using laser microfabrication and wet metallization processes, for example. Besides parasitic components, optical elements (e.g. waveguide, microlens, micro-mirrors) can also be buried into the glass substrate with laser micro-manufacturing and organic film deposition. These integrated electrical and optical components buried in the glass substrate provide interconnections between die stack on glass and external signal or power supplier.

In view of the several example devices described above and illustrated in the figures, it will be appreciated that embodiments of the presently disclosed invention include an electronic-photonic integrated-circuit assembly that comprises a carrier substrate and two or more integrated-circuit dies bonded to one another so as to form a die stack with first and second primary exterior surfaces corresponding, respectively, to an outer surface of a first one of the integrated-circuit dies and to an outer surface of a second one of the integrated-circuit dies, where at least one of the two or more integrated-circuit dies comprises one or more integrated photonic devices. One or more channels or passages (e.g., microfluidic or nanofluidic channels) are formed into the outer surface of the first one of the integrated-circuit dies, and a first surface of the carrier substrate is bonded to the outer surface of the first one of the integrated-circuit dies, thereby enclosing the one or more channels or passages. Further, each of the two or more integrated-circuit dies is electrically connected to at least one other integrated-circuit die via an electrically conductive through-wafer interconnect or an electrically conductive through-wafer via.

In some embodiments, the assembly described above or a variant thereof further includes an inlet fluid port and an outlet fluid port, each extending from at or near the outer surface of the second one of the integrated-circuit dies to at or near the outer surface of the first one of the integrated-circuit dies, so as to form fluidic connections with the one or more channels or passages.

In some embodiments, the first one of the integrated-circuit dies is a photonic integrated-circuit die. In others, the first one of the integrated-circuit dies is an electronic integrated-circuit die. In some embodiments, the assembly includes at least first and second photonic integrated-circuit dies immediately adjacent one another in the die stack, where the first and second photonic integrated-circuit dies are optically connected to one another via a photonic interconnect. In some embodiments, the assembly instead or additionally includes first and second photonic integrated-circuit dies separated from one another by at least one electronic integrated-circuit die, where the first and second photonic integrated-circuit dies are optically connected to one another via a photonic interconnect. The photonic interconnect in any of these embodiments may comprise a 3D optical waveguide or a photonic crystal, for example.

As discussed above, multiple assemblies may be stacked, to achieve even higher levels of 3D integration. Thus, some embodiments include a first electronic-photonic integrated-circuit assembly according to any of the embodiments described in the several preceding paragraphs as well as a second electronic-photonic integrated-circuit assembly according to any of these preceding paragraphs, where a second surface of the carrier substrate of the first electronic-photonic integrated-circuit assembly is bonded to the second electronic-photonic integrated-circuit assembly. In some of these stacked embodiments, the inlet fluid port and outlet fluid port of the first electronic-photonic integrated-circuit assembly are fluidically connected, respectively, to the inlet fluid port and outlet fluid port of the second electronic-photonic integrated-circuit assembly. Likewise, in some of these stacked embodiments, the first electronic-photonic integrated-circuit assembly is electrically or optically connected to the second electronic-photonic integrated-circuit assembly by a through-glass via.

Similarly, two or more electronic-photonic integrated-circuit assemblies according to any of the embodiments described above may be arranged on an interposing carrier, with the interposing carrier comprising one or more optical interconnects between at least one pair of the two or more electronic-photonic integrated-circuit assemblies.

It should also be appreciated, in view of the several techniques discussed above, that FIG. 9 illustrates an example method of forming an electronic-photonic integrated-circuit assembly, according to some of the presently disclosed techniques. Note that while FIG. 9 illustrates these steps in a particular order, these steps may not always (or even usually) be performed in this illustrated order.

As seen in block 910, the method includes bonding two or more integrated-circuit dies to one another so as to form a die stack with first and second primary exterior surfaces corresponding, respectively, to an outer surface of a first one of the integrated-circuit dies and to an outer surface of a second one of the integrated-circuit dies, wherein at least one of the two or more integrated-circuit dies comprises one or more integrated photonic devices, and wherein the first one of the integrated-circuit dies has one or more channels or passages formed into the outer surface of the first integrated circuit die. As seen in block 920, the method further includes bonding a first surface of a carrier substrate to the outer surface of the first one of the integrated-circuit dies, thereby enclosing the one or more channels or passages. The method still further includes electronically connecting each of the integrated-circuit dies to at least one other integrated-circuit die via an electrically conductive through-wafer interconnect or an electrically conductive through-wafer via, as shown at block 930.

Figure 9:
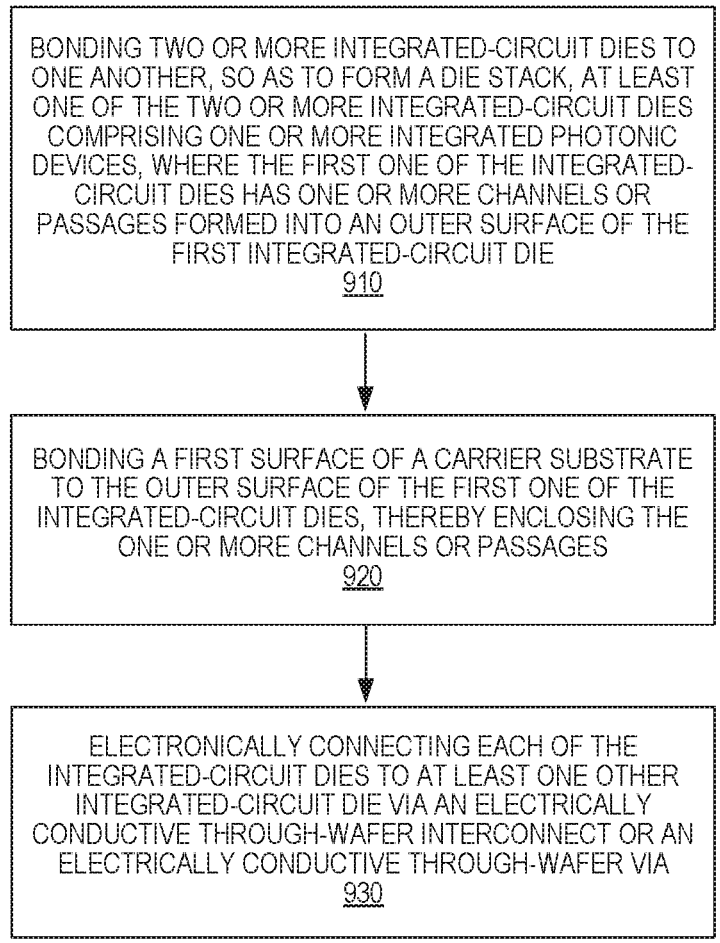
FIG. 9 is a process flow diagram illustrating an example method according to some embodiments of the presently disclosed techniques.
Figure 10:
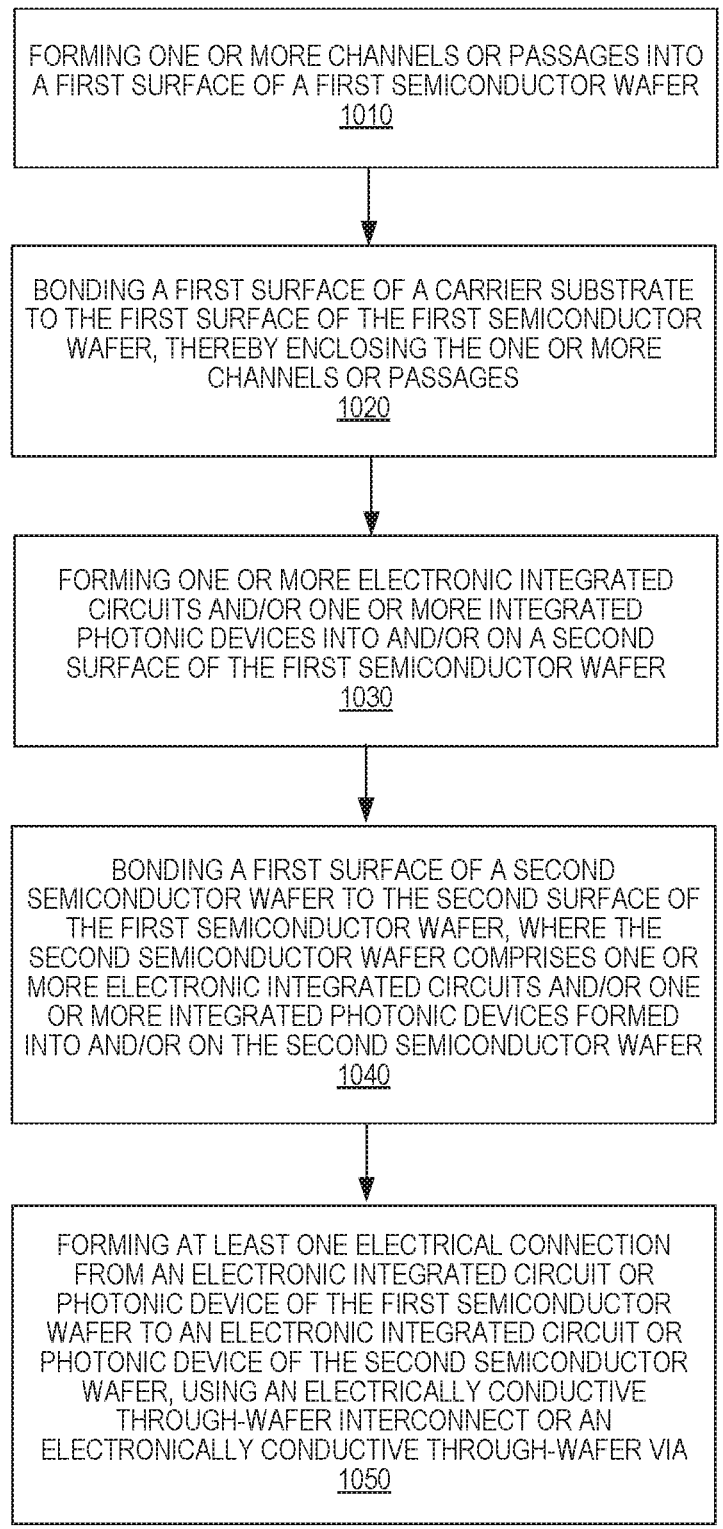
FIG. 10 is a process flow diagram illustrating another example method according to some embodiments of the presently disclosed techniques.

FIG. 10 is a process flow diagram illustrating another example method of forming an electronic-photonic integrated-circuit assembly, according to some embodiments, with this illustration providing more details than that of FIG. 9. Again, while FIG. 10 illustrates several steps in a particular order, some or all of these steps may be performed in a different order than shown, unless a particular order is compelled by the steps themselves.

As shown at block 1010, the illustrated method includes forming one or more channels or passages into a first surface of a first semiconductor wafer. As shown at block 1020, a first surface of a carrier substrate is bonded to the first surface of the first semiconductor wafer, thereby enclosing the one or more channels or passages.

As shown at block 1030, the method further includes forming one or more electronic integrated circuits and/or one or more integrated photonic devices into and/or on a second surface of the first semiconductor wafer. A first surface of a second semiconductor wafer is bonded to the second surface of the first semiconductor wafer, as shown at block 1040, where the second semiconductor wafer comprises one or more electronic integrated circuits and/or one or more integrated photonic devices formed into and/or on the second semiconductor wafer. As shown at block 1050, the method further includes forming at least one electrical connection from an electronic integrated circuit or photonic device of the first semiconductor wafer to an electronic integrated circuit or photonic device of the second semiconductor wafer, using an electrically conductive through-wafer interconnect or an electronically conductive through-wafer via.

While not shown in FIG. 10, the method may include, in some embodiments, forming one or more integrated photonic devices into and/or on the second surface of the first semiconductor wafer. In some embodiments, the method may further include forming an inlet port and outlet port, with each port extending through the first and second semiconductor wafers and with each being formed so as to be in fluidic connection with the one or more channels or passages.

In various embodiments of the method illustrated in FIG. 10, the first and second semiconductor wafers each comprise integrated photonic devices, with the method in these embodiments further comprising forming at least one photonic interconnect between an integrated photonic device of the first semiconductor wafer and an integrated photonic device of the second semiconductor wafer. In some embodiments, the method further includes bonding a first surface of a third semiconductor wafer to a second surface of the second semiconductor wafer, where the third semiconductor wafer comprises one or more electronic integrated circuits and/or one or more integrated photonic devices formed into and/or on the third semiconductor wafer. In some of these latter embodiments, the first and third semiconductor wafers each comprise one or more integrated photonic devices, and the method further comprises forming at least one photonic interconnect between an integrated photonic device of the first semiconductor wafer and an integrated photonic device of the third semiconductor wafer.

It will be appreciated that several electronic-photonic integrated-circuit assemblies may be formed according to the method shown in FIG. 10, or according to variants thereof. These assemblies may be combined in various ways, to achieve higher levels of integration. Thus, for example, first and second electronic-photonic integrated-circuit assemblies may be fabricated according to the method shown in FIG. 10, after which a second surface of the carrier substrate of the first electronic-photonic integrated-circuit assembly is bonded to the second electronic-photonic integrated-circuit assembly, thereby forming a 3D-EPIC stack as described above. In some embodiments, an inlet fluid port and outlet fluid port may be formed so as to extend through the first and second semiconductor wafers of each of these first and second electronic-photonic integrated-circuit assemblies, with each being formed so as to be in fluidic connection with the one or more channels or passages of each of the first and second electronic-photonic integrated-circuit assemblies. In some embodiments formed according to this approach, the assembly method may further comprise electrically or optically connecting the first electronic-photonic integrated-circuit assembly to the second electronic-photonic integrated-circuit assembly, using a through-glass via.

It will be appreciated that the above description and the claims appended hereto comprehend methods and devices that vary from the examples specifically illustrated in the attached figures. In particular, it will be appreciated that features from any one of the examples described above may be combined with features from other examples, unless the description or attendant details indicate otherwise. Accordingly, the inventive techniques and devices disclosed herein are not limited to any one or several ones of the specifically described or illustrated examples.

ABBREVIATIONS

| Abbreviation | Explanation |
| --- | --- |
| 2D | 2 Dimensional |
| 2.5D | 2 Dimensional with low profile traversal in the third dimension |
| 3D | 3 Dimensional |
| CMOS | Complementary Metal-Oxide-Semiconductor |
| EIC | Electronic integrated Circuit |
| EPIC | Electronic & Photonic Integrated Circuit |
| Fs | Femtosecond |
| Ge | Germanium |
| IC | Integrated Circuit |
| PIC | Photonic Integrated Circuit |
| SOI | Silicon-on-Insulator |
| TGV | Through-Glass Via |
| TSV | Through-Silicon Via |
| TWI | Through-Wafer Interconnect |

What is claimed is:

1. An electronic-photonic integrated-circuit assembly comprising:
    two or more integrated-circuit dies bonded to one another so as to form a die stack with first and second primary exterior surfaces corresponding, respectively, to an outer surface of a first one of the integrated-circuit dies and to an outer surface of a second one of the integrated-circuit dies, at least one of the two or more integrated-circuit dies comprising one or more integrated photonic devices, wherein the first one of the integrated-circuit dies is a photonic integrated-circuit die; and
    a carrier substrate;
    wherein one or more channels or passages are formed into the outer surface of the first one of the integrated-circuit dies, and wherein a first surface of the carrier substrate is bonded to the outer surface of the first one of the integrated-circuit dies, thereby enclosing the one or more channels or passages; and
    wherein each of the two or more integrated-circuit dies is electrically connected to at least one other integrated-circuit die via an electrically conductive through-wafer interconnect or an electrically conductive through-wafer via.

2. The electronic-photonic integrated-circuit assembly of claim 1, further comprising an inlet fluid port and an outlet fluid port, each extending from at or near the outer surface of the second one of the integrated-circuit dies to at or near the outer surface of the first one of the integrated-circuit dies, so as to form fluidic connections with the one or more channels or passages.

3. The electronic-photonic integrated-circuit assembly of claim 1, wherein the two or more integrated-circuit dies comprise first and second photonic integrated-circuit dies immediately adjacent one another in the die stack, and wherein the first and second photonic integrated-circuit dies are optically connected to one another via a photonic interconnect.

4. The electronic-photonic integrated-circuit assembly of claim 3, wherein the photonic interconnect comprises a three-dimensional (3D) optical waveguide or a photonic crystal.

5. The electronic-photonic integrated-circuit assembly of claim 1, wherein the two or more integrated-circuit dies comprise first and second photonic integrated-circuit dies separated from one another by at least one electronic integrated-circuit die, and wherein the first and second photonic integrated-circuit dies are optically connected to one another via a photonic interconnect.

6. An assembly comprising a first electronic-photonic integrated-circuit assembly according to claim 1 and a second electronic-photonic integrated-circuit assembly according to claim 1, wherein a second surface of the carrier substrate of the first electronic-photonic integrated-circuit assembly is bonded to the second electronic-photonic integrated-circuit assembly.

7. The assembly of claim 6, wherein the first electronic-photonic integrated-circuit assembly and the second electronic-photonic integrated-circuit assembly each comprise an inlet fluid port and an outlet fluid port, each port extending from at or near the outer surface of the second one of the integrated-circuit dies to at or near the outer surface of the first one of the integrated-circuit dies, so as to form fluidic connections with the one or more channels or passages, and wherein the inlet fluid port and outlet fluid port of the first electronic-photonic integrated-circuit assembly are fluidically connected, respectively, to the inlet fluid port and outlet fluid port of the second electronic-photonic integrated-circuit assembly.

8. The assembly of claim 6, wherein the first electronic-photonic integrated-circuit assembly is electrically or optically connected to the second electronic-photonic integrated-circuit assembly by a through-glass via.

9. An assembly comprising two or more electronic-photonic integrated-circuit assemblies according to claim 1 arranged on an interposing carrier, the interposing carrier comprising one or more optical interconnects between at least one pair of the two or more electronic-photonic integrated-circuit assemblies.

10. A method of forming an electronic-photonic integrated-circuit assembly, the method comprising:
bonding two or more integrated-circuit dies to one another so as to form a die stack with first and second primary exterior surfaces corresponding, respectively, to an outer surface of a first one of the integrated-circuit dies and to an outer surface of a second one of the integrated-circuit dies, wherein at least one of the two or more integrated-circuit dies comprises one or more integrated photonic devices, wherein the first one of the integrated-circuit dies is a photonic integrated-circuit die, and
wherein the first one of the integrated-circuit dies has one or more channels or passages formed into the outer surface of the first integrated circuit die; and
bonding a first surface of a carrier substrate to the outer surface of the first one of the integrated-circuit dies, thereby enclosing the one or more channels or passages; and
electronically connecting each of the integrated-circuit dies to at least one other integrated-circuit die via an electrically conductive through-wafer interconnect or an electrically conductive through-wafer via.

11. A method of forming an electronic-photonic integrated-circuit assembly, the method comprising:
forming one or more channels or passages into a first surface of a first semiconductor wafer;
bonding a first surface of a carrier substrate to the first surface of the first semiconductor wafer, thereby enclosing the one or more channels or passages;
forming one or more electronic integrated circuits and/or one or more integrated photonic devices into and/or on a second surface of the first semiconductor wafer;
bonding a first surface of a second semiconductor wafer to the second surface of the first semiconductor wafer, the second semiconductor wafer comprising one or more integrated photonic devices formed into and/or on the second semiconductor wafer; and
forming at least one electrical connection from an electronic integrated circuit or photonic device of the first semiconductor wafer to an electronic integrated circuit or photonic device of the second semiconductor wafer, using an electrically conductive through-wafer interconnect or an electronically conductive through wafer via; and
forming at least one photonic interconnect between an integrated photonic device of the first semiconductor wafer and an integrated photonic device of the second semiconductor wafer.

12. The method of claim 11, wherein the method comprises forming one or more integrated photonic devices into and/or on the second surface of the first semiconductor wafer.

13. The method of claim 11, further comprising forming an inlet port and outlet port, each extending through the first and second semiconductor wafers and each being formed so as to be in fluidic connection with the one or more channels or passages.

14. The method of claim 11, further comprising bonding a first surface of a third semiconductor wafer to a second surface of the second semiconductor wafer, the third semiconductor wafer comprising one or more electronic integrated circuits and/or one or more integrated photonic devices formed into and/or on the third semiconductor wafer.

15. The method of claim 14, wherein the first and third semiconductor wafers each comprise one or more integrated photonic devices, the method further comprising forming at least one photonic interconnect between an integrated photonic device of the first semiconductor wafer and an integrated photonic device of the third semiconductor wafer.

16. A method of producing an assembly, the method comprising:
forming first and second electronic-photonic integrated-circuit assemblies according to the method of claim 11; and
bonding a second surface of the carrier substrate of the first electronic-photonic integrated circuit assembly to the second electronic-photonic integrated-circuit assembly.

17. The method of claim 16, further comprising forming an inlet fluid port and outlet fluid port extending through the first and second semiconductor wafers of each of the first and second electronic-photonic integrated-circuit assemblies, with each being formed so as to be in fluidic connection with the one or more channels or passages of each of the first and second electronic-photonic integrated-circuit assemblies.

18. The method of claim 17, further comprising electrically or optically connecting the first electronic-photonic integrated-circuit assembly to the second electronic-photonic integrated-circuit assembly, using a through-glass via.

* * * * *